(12) United States Patent
Jarry et al.

(10) Patent No.: US 8,486,763 B2
(45) Date of Patent: Jul. 16, 2013

(54) METHOD FOR THINNING AND DICING ELECTRONIC CIRCUIT WAFERS

(75) Inventors: Vincent Jarry, La Membrolle sur Choisille (FR); Marc Feron, Paris (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/313,282

(22) Filed: Dec. 7, 2011

(65) Prior Publication Data

US 2012/0149174 A1     Jun. 14, 2012

(30) Foreign Application Priority Data

Dec. 10, 2010 (FR) ...................................... 10 60375

(51) Int. Cl.
*H01L 21/00*     (2006.01)
(52) U.S. Cl.
USPC ......................................................... 438/113

(58) Field of Classification Search
USPC ................. 435/106, 464; 438/106, 464, 113, 438/118
See application file for complete search history.

(56) References Cited

U.S. PATENT DOCUMENTS

| 5,731,222 A * | 3/1998 | Malloy et al. ................. 438/113 |
| 2005/0142815 A1 | 6/2005 | Miyazaki et al. |
| 2005/0176169 A1 | 8/2005 | Koizumi et al. |
| 2008/0315434 A1 | 12/2008 | McElrea et al. |

* cited by examiner

*Primary Examiner* — Walter H Swanson
*Assistant Examiner* — Wilner Jean Baptiste
(74) *Attorney, Agent, or Firm* — The Noblitt Group, PLLC

(57) ABSTRACT

A method for thinning and dicing a wafer of electronic circuits, wherein: a thinning step is carried out while the wafer is supported by a first film bonded at the periphery of a support frame; and a dicing step is carried out while the thinned wafer is supported by a second film bonded at the periphery of the same frame from the other surface of the wafer, the first film being unstuck only once the second one is in place.

6 Claims, 2 Drawing Sheets

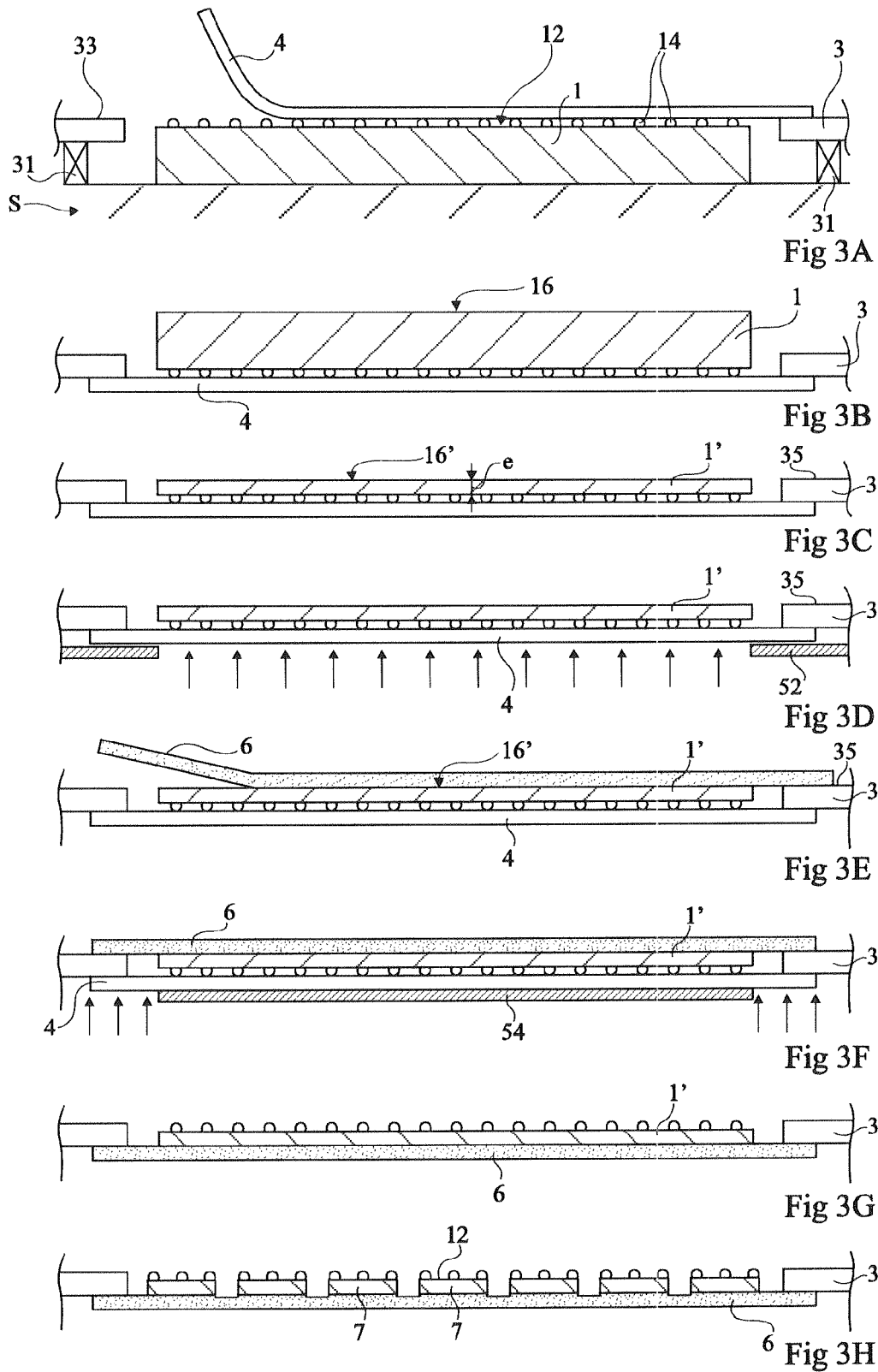

METHOD FOR THINNING AND DICING ELECTRONIC CIRCUIT WAFERS

CROSS REFERENCE TO RELATED APPLICATION

This application is a translation of and claims the priority benefit of French patent application number 10/60375 filed Dec. 10, 2010, entitled "Method for thinning and dicing electronic circuit wafers," which is hereby incorporated by reference to the maximum extent allowable by law.

BACKGROUND OF THE INVENTION

1. Field of the Invention

The present invention generally relates to the manufacturing of electronic circuits and, more specifically, to processing performed at the end of manufacturing, once the different electronic circuit forming steps have been carried out on a wafer.

2. Discussion of Prior Art

The manufacturing of electronic circuits, on a semi-conductor substrate or on an insulating substrate (for example, made of glass) comprises many steps carried out on entire wafers, most often until the forming of conductive bumps intended for the electric connection of electronic circuit chips, once the chips have been individualized by dicing of the wafer.

In many applications, the wafer is thinned down to decrease the final thickness of the circuits. However, the thinning step is not the last one. There in particular remains to dice the wafer in order to individualize the electronic circuit chips. A problem then is that a thinned-down wafer no longer provides a sufficient mechanical strength to be handled as it is from one piece of equipment to another. This problem is present as soon as the thickness of a wafer is below a few hundreds of micrometers, typically less than 200 micrometers, knowing that wafers are currently thinned down to thicknesses on the order of 50 micrometers.

SUMMARY OF THE INVENTION

An embodiment disclosed herein overcomes all or part of the disadvantages of usual wafer thinning and dicing techniques.

A feature of an embodiment disclosed herein is to decrease risks of wafer deformation after dicing.

Another feature of an embodiment disclosed herein is to provide a method compatible with wafers made of a semiconductor material as well as with wafers made of an insulating material, especially glass.

Another feature of an embodiment disclosed herein is to provide a solution compatible with the use of usual thinning and dicing equipment.

To achieve all or part of these and other features, an embodiment provides a method for thinning and dicing a wafer of electronic circuits, wherein:

a thinning step is carried out while the wafer is supported by a first film bonded at the periphery of a support frame; and a dicing step is carried out while the thinned wafer is supported by a second film bonded at the periphery of the same frame from the other surface of the wafer, the first film being unstuck only once the second one is in place.

According to an embodiment, the thickness of the frame is selected to correspond to the final thickness of the electronic circuits.

According to an embodiment, the method comprises the steps of:

placing the first film on a first surface of the wafer;

thinning the wafer from a second surface;

placing the second film against the second surface of the thinned wafer;

removing the first film; and dicing the wafer from its first surface.

According to an embodiment, a step of an accessible surface of the first film prior to its separation is further provided.

According to an embodiment, said insolation step is carried out after the second film has been installed.

According to an embodiment, said insolation step is carried out:

first, on the central portion above the wafer before the second film is installed; and second, at the periphery above the frame after the second film has been installed.

An embodiment provides a frame for handling an electronic circuit wafer, wherein the thickness of the frame is selected to correspond to the final thickness of the electronic circuits.

An embodiment provides a frame for handling an electronic circuit wafer, capable of implementing the thinning and dicing method.

An embodiment provides an installation for thinning and dicing electronic circuit wafers, capable of implementing the thinning and dicing method.

The foregoing and other features, and benefits of the disclosed embodiments will be discussed in detail in the following non-limiting description of specific embodiments in connection with the accompanying drawings.

BRIEF DESCRIPTION OF THE DRAWINGS

FIGS. 3A, 3B, 3C, 3D, 3E, 3F, 3G, and 3H schematically show in cross-section views an embodiment of a method for thinning and individualizing electronic circuits manufactured from wafers.

DETAILED DESCRIPTION

Figure 1A:
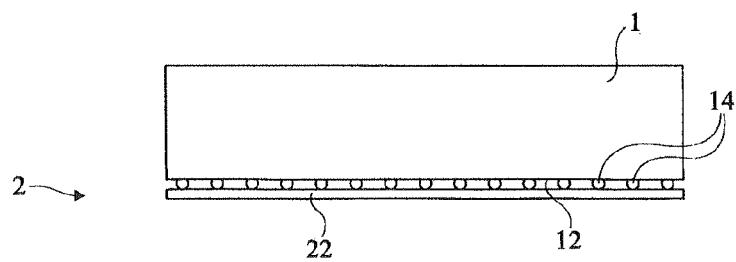
FIGS. 1A, 1B, and 1C are simplified cross-section views illustrating a usual semiconductor wafer thinning method.

The same elements have been designated with the same reference numerals in the different drawings. For clarity, only those steps and elements which are useful to the understanding of the present invention have been shown and will be described. In particular, the destination of the manufactured electronic circuits has not been detailed, the present invention being compatible with usual destinations of such circuits. Further, the steps of forming, for example, integrated or monolithic circuits in a semiconductor wafer or passive circuits on an insulating wafer (for example, made of glass) have not been detailed either, the present invention being here again compatible with usual processings, prior to the thinning, between the thinning and the dicing, and following the dicing.

Figure 1B:
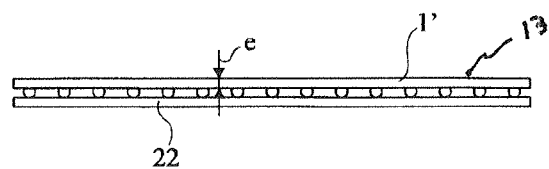
Figure 1C:
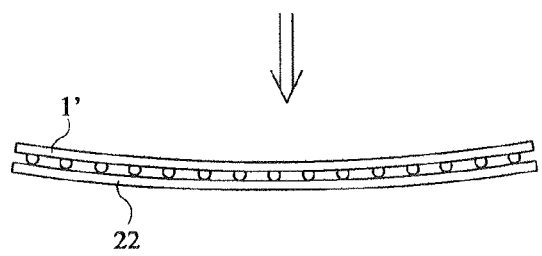

FIGS. 1A, 1B, and 1C illustrate usual steps of thinning of a wafer on which electronic circuits have been formed.

A wafer 1 is, at the end of its manufacturing, and possibly after forming on a first surface 12, arbitrarily called front surface, of conductive bumps 14 intended for the subsequent connection of chips formed in wafer 1, placed on a film 22 of a thinning device 2. Film 22 is adhesive to be bonded to surface 12. The film surface, opposite to the wafer, is placed on a support (typically, a table), not shown, of the thinning device.

As illustrated in FIG. 1B, a second surface 13 (arbitrarily called rear surface) of the wafer is submitted to a thinning step, for example, by chem.-mech. polishing, to obtain a final thickness "e" desired for the circuits.

Once this thinning step is over, thinned wafer 1' must be diced to individualize the electronic circuit chips that it comprises. Such a dicing is performed from front surface 12 of the wafer and thus requires transferring it to another piece of equipment. For such a transfer, wafer 1' must be transferred to another support film.

As illustrated in FIG. 1C, due to the small thickness of wafer 1' and to the flexibility of film 22, wafer 1' tends to deform. It then risks deteriorating. Further, its handling is difficult.

In most materials, a wafer starts deforming when its thickness becomes smaller than 200 micrometers. Now, it is currently often desired to obtain electronic circuit chips having a final thickness on the order of 50 micrometers.

Figure 2:
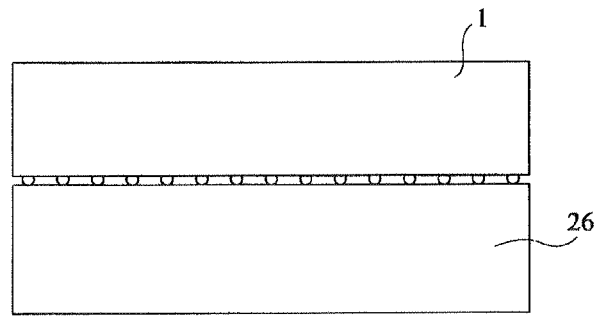
FIG. 2 illustrates a usual technique for solving the problem of the thinning of a wafer and of its transfer between pieces of equipment.

FIG. 2 very schematically shows an example of a usual solution to such a problem.

Wafer 1 is, before thinning, bonded to a handle 26 formed of a thick wafer. This handle enables to transport the wafer to the dicing device at the end of the thinning and is removed before the dicing step, once the wafer has been placed on a dicing film.

Using such a handle adds steps in the process and is both impractical and expensive.

FIGS. 3A, 3B, 3C, 3D, 3E, 3F, 3G, and 3H are simplified cross-section views illustrating an embodiment of a thinning and dicing method.

FIG. 3A illustrates the positioning of a wafer 1 to be processed in a handling frame 3. Wafer 1 has, as previously, been submitted to all the manufacturing steps prior to its thinning and dicing. For example, integrated circuits have been formed in a semiconductor wafer 1 or passive elements have been formed on an insulating substrate 1. Further, it is assumed as an example that conductive bumps 14 have been formed on a first surface 12 (arbitrarily called front surface) of the wafer.

Wafer 1 is laid on a planar surface S of an assembly device in the open space of frame 3. Frame 3 is supported by spacers 31 so that its upper peripheral surface 33 (in the orientation of the drawings) is coplanar with the surface of bumps 14. Any other means for temporarily maintaining the relative height of the wafer and of the frame may be provided. An adhesive film 4 is placed on the front surface side 12 of wafer 1, and has its periphery further extending over frame 3. Support film 4 is of the type currently used to support a wafer in a thinning installation. The fact of placing frame 3 level with front surface 12 (more specifically, bumps 14) of wafer 1 enables film 4 to be properly stretched.

Once film 4 has been bonded, frame 3 and wafer 1 are flipped (FIG. 3B) to make the other surface 16 (arbitrarily called rear surface) of wafer 1 accessible.

Finally, the assembly is placed in a device for thinning rear surface 16 of wafer 1 which is thinned down to the desired final thickness "e" (FIG. 3C).

According to a preferred embodiment, the thickness of frame 3 is selected to correspond to the final thickness of the wafer (including the height of bumps 14). Thus, as illustrated in FIG. 3C, rear surface 16' of thinned wafer 1' is coplanar with the second surface 35 or rear surface (upper surface in FIG. 3C) of frame 3.

The next step illustrated in FIG. 3D is optional and comprises insolating the apparent surface of film 4 in its central portion above wafer 1'. For this purpose, a peripheral mask 52 avoiding to insolate the periphery of the film bonded to frame 3 is used. The object of this insolation step is to pre-separate wafer 1' from film 4. This option is particularly intended for the use of wafers having a sufficiently thin final thickness for the wafer to be crossed by the insolation rays. If the substrates are thick enough to be opaque to the insolation radiation, step 3D may be omitted and performed later on. This aspect will be better understood hereafter in relation with FIG. 3F.

Then (FIG. 3E), an adhesive film 6 is placed on rear surface 16' of the wafer, with an extension over rear surface 35 of frame 3. Stretched film 6 is of the type used to support the wafers in dicing operations (for example, by sawing or laser cutting).

The next step (FIG. 3F), comprises preparing the separation of film 4 used in the thinning step. To achieve this, the accessible rear surface of this film is submitted to an insolation step.

The example of FIG. 3F illustrates the case of a thin wafer having a central portion which has already been insolated in FIG. 3D. In this case, a mask 54 is used to mask the central portion of film 4 and only insolate its periphery above frame 3. This aims at avoiding causing an unwanted separation of film 6 by the crossing of ultraviolet rays through too thin a substrate.

In the case of the processing (not shown) of a sufficiently thick wafer (generally from 150 to 200 micrometers), the step of insolation for pre-separation of film 4 may be carried out directly during the step of FIG. 3F without providing mask 54.

Once film 4 has been removed, the assembly of frame 3, thinned wafer 1', and film 6 is flipped, then placed in a device for dicing the wafer from its front surface 12. The benefit of providing a thickness of frame 3 corresponding to the final thickness of the electronic circuits of the wafer here becomes apparent. This provides a good tension of film 6 without any risk for it to start wrinkling under the weight of wafer 1 when the assembly is flipped.

Finally, as shown in FIG. 3H, electronic circuits 7 are individualized by dicing from front surface 12 of wafer 1'. This step is carried out while the assembly is supported by film 6 and frame 3.

The order of the steps of FIGS. 3F and 3G may be inverted.

At none of the steps has the thinned wafer been supported by a film only, with no frame for stretching the film. Any prejudicial deformation of thinned wafer 1' is thus avoided. Further, the maintaining of the wafer in a same frame 3 during all steps optimizes the thinning and dicing steps.

Various embodiments have been described, different alterations and modifications will occur to those skilled in the art. In particular, other processings may be interposed between the thinning and the dicing, provided to be compatible with the use of a frame and of a wafer supported by a film. For example, a laser marking of the chips may be performed on rear surface 16' thereof after thinning (after step 3B) as shown in FIG. 3B. Further, although the above embodiments have been described in relation with an example of application to wafers provided with conductive bumps, they also apply to the case where such bumps are absent as long as the wafers are integral (for example, by being formed after the dicing). This has no influence upon the steps provided by the described embodiments. Further, the practical implementation of the present invention is within the abilities of those skilled in the art based on the functional indications given hereabove and by using usual equipment.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for thinning and dicing a wafer of electronic circuits, wherein:
   a thinning step is carried out while a first surface of the wafer is supported by a first film bonded at its periphery to a first surface of a support frame; and
   a dicing step is carried out while a second surface of the thinned wafer is supported by a second film bonded at its periphery to a second surface of the support frame, the first film being unstuck only once the second film is in place.

2. The method of claim 1, wherein a thickness of the frame measured between the first surface of the frame and the second surface of the frame, is selected to correspond to final thickness of the wafer.

3. The method of claim 1, comprising the steps of:
   placing the first film on the first surface of the wafer;
   thinning the wafer from the second surface;
   placing the second film against the second surface of the thinned wafer;
   removing the first film; and
   dicing the wafer from its first surface.

4. The method of claim 3, further comprising insolating an accessible surface of the first film prior to its separation.

5. The method of claim 4, wherein said insolating the accessible surface of the first film is carried out after the second film has been placed against the second surface of the thinned wafer.

6. The method of claim 4, wherein said insolating step is carried out:
   first, on a central portion of the first film above the wafer before the second film is placed against the second surface of the thinned wafer; and
   second, at the periphery of the first film above the frame after the second film has been placed against the second surface of the thinned wafer.

* * * * *